United States Patent
Choi et al.

(10) Patent No.: US 10,534,259 B2
(45) Date of Patent: Jan. 14, 2020

(54) METHOD AND SYSTEM FOR IMPRINT FORCE CONTROL

(71) Applicant: Canon Kabushiki Kaisha, Tokyo (JP)

(72) Inventors: Byung-Jin Choi, Austin, TX (US); Mario Johannes Meissl, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 76 days.

(21) Appl. No.: 15/471,070

(22) Filed: Mar. 28, 2017

(65) Prior Publication Data

US 2018/0284604 A1 Oct. 4, 2018

(51) Int. Cl.
*G03F 7/00* (2006.01)

(52) U.S. Cl.
CPC .................................. *G03F 7/0002* (2013.01)

(58) Field of Classification Search
CPC .................................................. G03G 7/0002
USPC ....................................................... 101/450.1
See application file for complete search history.

(56) References Cited

U.S. PATENT DOCUMENTS

| | | | |
|---|---|---|---|
| 5,345,206 A | 9/1994 | Morcos | |
| 6,847,433 B2 * | 1/2005 | White | B82Y 10/00 250/491.1 |
| 6,873,087 B1 | 3/2005 | Choi | |
| 6,932,934 B2 | 8/2005 | Choi | |
| 7,157,036 B2 | 1/2007 | Choi | |
| 8,579,625 B2 * | 11/2013 | Kruijt-Stegeman | B82Y 10/00 425/385 |
| 8,742,632 B1 * | 6/2014 | Eghbal | H02K 33/18 310/12.16 |
| 9,218,931 B2 * | 12/2015 | Lee | H01H 51/01 |
| 2004/0124566 A1 | 7/2004 | Sreenivasan | |
| 2004/0188381 A1 | 9/2004 | Sreenivasan | |
| 2004/0211754 A1 | 10/2004 | Sreenivasan | |
| 2005/0187339 A1 | 8/2005 | Xu | |
| 2006/0001857 A1 * | 1/2006 | Cherala | B82Y 10/00 355/72 |
| 2007/0145639 A1 * | 6/2007 | Seki | B82Y 10/00 264/293 |
| 2008/0093339 A1 * | 4/2008 | Kasumi | B29C 59/022 216/54 |

(Continued)

OTHER PUBLICATIONS

Bill Black et al., "Basics of Voice Coil Actuators," 44 PCIM, Jul. 1993, retrieved from <http://www.acm-magnetics.com/acm/pdfs/15-BasicsOfVCMs.pdf>, 3 pages.

*Primary Examiner* — Anthony H Nguyen
(74) *Attorney, Agent, or Firm* — Canon U.S.A., Inc. IP Division

(57) ABSTRACT

Methods, systems, and apparatus for applying an imprinting force to an imprint lithography template, including providing, by a controller using a first control loop, a first control signal to a first actuator associated with the first control loop; providing, by the controller using a second control loop, a second control signal to a second actuator associated with the second control loop, wherein the second control loop and the first control loop are different; and applying, to the imprint lithography template, at least one of: a first force by the first actuator in response to the first control signal, and a second force by the second actuator in response to the second control signal.

22 Claims, 7 Drawing Sheets

(56) References Cited

U.S. PATENT DOCUMENTS

| | | | | |
|---|---|---|---|---|
| 2008/0122138 A1* | 5/2008 | Zhang | ............... | B29C 59/022 |
| | | | | 264/293 |
| 2009/0140445 A1* | 6/2009 | Lu | ..................... | B29C 43/003 |
| | | | | 264/40.1 |
| 2013/0139713 A1* | 6/2013 | Cho | ................. | G03F 7/0002 |
| | | | | 101/333 |
| 2013/0182236 A1* | 7/2013 | De Schiffart | ........ | B29C 43/021 |
| | | | | 355/74 |
| 2015/0190961 A1* | 7/2015 | Nakagawa | ........... | G03F 7/0002 |
| | | | | 264/40.5 |
| 2016/0015311 A1* | 1/2016 | Jiang | .................... | A61F 2/80 |
| | | | | 623/33 |

* cited by examiner

METHOD AND SYSTEM FOR IMPRINT FORCE CONTROL

BACKGROUND

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

SUMMARY

Innovative aspects of the subject matter described in this specification may be embodied in a method of applying an imprinting force to an imprint lithography template, including providing, by a controller using a first control loop, a first control signal to a first actuator associated with the first control loop; providing, by the controller using a second control loop, a second control signal to a second actuator associated with the second control loop, wherein the second control loop and the first control loop are different; and applying, to the imprint lithography template, at least one of: a first force by the first actuator in response to the first control signal, and a second force by the second actuator in response to the second control signal.

Other embodiments of these aspects include corresponding systems configured to perform the actions of the method.

These and other embodiments may each optionally include one or more of the following features. For instance, applying only the second force to the imprint lithography template to facilitate filling of features of the imprint lithography template by an imprint resist in contact with the imprint lithography template. The second force is between 0.1 N and 3 N. Applying only the second force to the imprint lithography template during the polymerization of an imprint resist positioned on a substrate, the imprint resist in contact with the imprint lithography template. Applying the first force to the imprint lithography template to facilitate an initial contact between the imprint lithography template and an imprint resist positioned on a substrate. Applying the second force to the imprint lithography template to facilitate the initial contact between the imprint lithography template and the imprint resist positioned on the substrate. The first force is greater than the second force. The first force is between 0.1 N and 300 N, and the second force is between 0.1 N and 3 N. Applying the first force to the imprint lithography template to facilitate separation of the imprint lithography template and a polymeric layer positioned on a substrate. Applying the second force to the imprint lithography template to facilitate separation of the imprint lithography template and the polymeric layer positioned on the substrate.

Innovative aspects of the subject matter described in this specification may be embodied in an actuation system for applying an imprinting force to an imprint lithography template, including a first actuator configured to apply a first force to the imprint lithography template, the first actuator associated with a first control loop; a second actuator configured to apply a second force to the imprint lithography template, the second actuator associated with a second control loop, wherein the first control loop and the second control loop are different; and a controller configured to provide at least one of: a first control signal to the first actuator via the first control loop such that the first actuator applies the first force to the imprint lithography template, and a second control signal to the second actuator via the second control loop such that the second actuator applies the second force to the imprint lithography template.

Other embodiments of these aspects include corresponding methods configured to perform the actions of the system.

These and other embodiments may each optionally include one or more of the following features. For instance, the controller is configured to provide only the second control signal to the second actuator such that the second actuator applies the second force to the imprint lithography template to facilitate filling of features of the imprint lithography template by an imprint resist in contact with the imprint lithography template. The controller is configured to provide only the second control signal to the second actuator such that the second actuator applies the second force to the imprint lithography template during the polymerization of an imprint resist positioned on a substrate, the imprint resist in contact with the imprint lithography template. The controller is configured to provide the first control signal to the first actuator such that the first actuator applies the first force to the imprint lithography template to facilitate an initial contact between the imprint lithography template and an imprint resist positioned on a substrate. The controller is configured to provide the second control signal to the second actuator such that the second actuator applies the second force to the imprint lithography template to facilitate the initial contact between the imprint lithography template and the imprint resist positioned on the substrate. The controller is configured to provide the first control signal to the first actuator such that the first actuator applies the first force to the imprint lithography template to facilitate separation of the imprint lithography template and a polymeric layer positioned on a substrate. The controller is configured to provide the second control signal to the second actuator such that the second actuator applies the second force to the imprint lithography template to facilitate separation of the imprint lithography template and a polymeric layer positioned on the substrate.

Particular implementations of the subject matter described in this specification can be implemented so as to realize one or more of the following advantages. Implementations of the present disclosure provide increased force accuracy and stability and minimization of errors in force control, e.g., during filling of features of a template by a polymerizable material and polymerization of the polymerizable material when forming a polymeric layer.

The details of one or more embodiments of the subject matter described in this specification are set forth in the accompanying drawings and the description below. Other potential features, aspects, and advantages of the subject matter will become apparent from the description, the drawings, and the claims.

DETAILED DESCRIPTION

Figure 1:
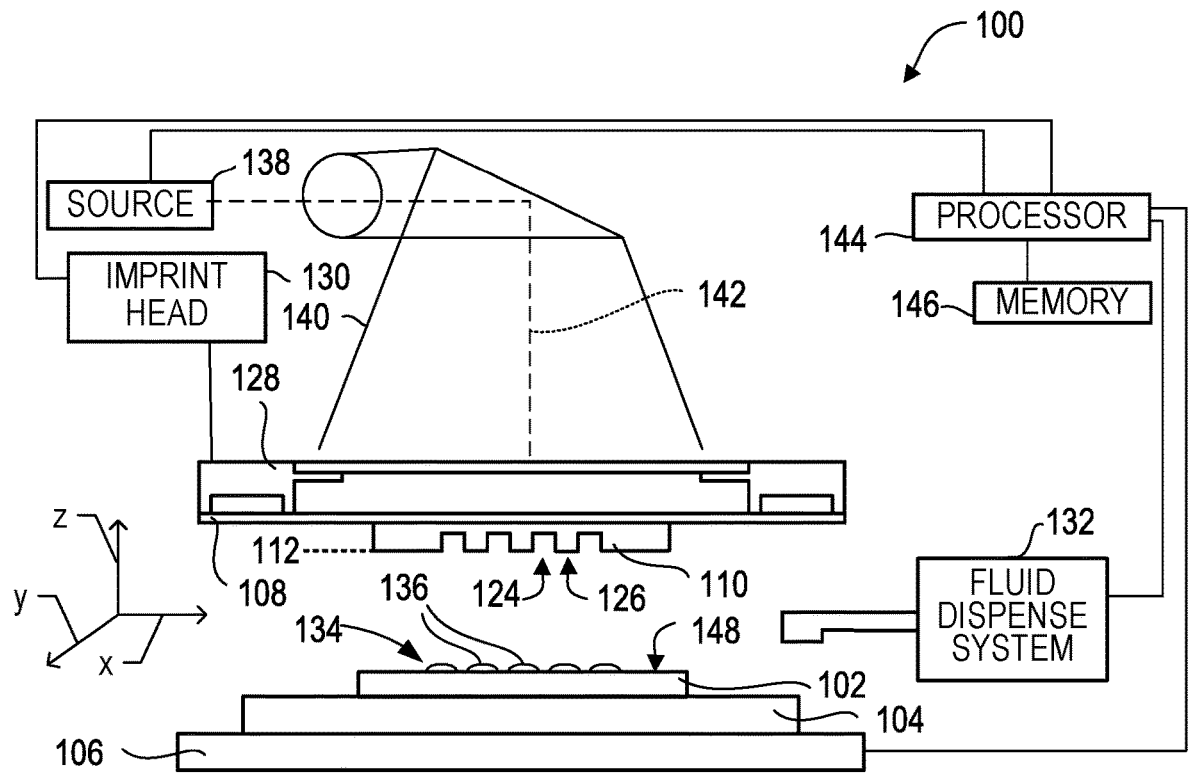
FIG. 1 illustrates a simplified side view of a lithographic system in accordance with embodiments of the present invention.

FIG. 1 illustrates an imprint lithography system 100 that forms a relief pattern on a substrate 102. The substrate 102 may be coupled to a substrate chuck 104. In some examples, the substrate chuck 104 can include a vacuum chuck, a pin-type chuck, a groove-type chuck, an electromagnetic chuck, and/or the like. Exemplary chucks are described in U.S. Pat. No. 6,873,087, which is hereby incorporated by reference herein. The substrate 102 and the substrate chuck 104 may be further supported by a stage 106. The stage 106 provides translational motion in x-y and rotational motion about the z-axis. The stage 106, the substrate 102, and the substrate chuck 104 may also be positioned on a base (not shown).

The imprint lithography system 100 further includes an imprint lithography template 108 that is spaced-apart from the substrate 102. In some examples, the template 108 includes a mesa 110 (mold 110) that extends from the template 108 towards the substrate 102. In some examples, the mold 110 includes a patterning surface 112. The template 108 and/or the mold 110 may be formed from such materials including, but not limited to, fused-silica, quartz, silicon, organic polymers, siloxane polymers, borosilicate glass, fluorocarbon polymers, metal, hardened sapphire, and/or the like. In the illustrated example, the patterning surface 112 includes a plurality of features defined by spaced-apart recesses 124 and/or protrusions 126. However, in some examples, other configurations of features are possible. The patterning surface 112 may define any original pattern that forms the basis of a pattern to be formed on substrate 102.

The template 108 may be coupled to a template chuck 128. In some examples, the template chuck 128 can include a vacuum chuck, a pin-type chuck, a groove-type chuck, an electromagnetic chuck, and/or the like. Exemplary chucks are described in U.S. Pat. No. 6,873,087, which is hereby incorporated by reference herein. Further, the template chuck 128 may be coupled to an imprint head 130 such that the template chuck 128 and/or the imprint head 130 may be configured to facilitate movement of the template 108.

The imprint lithography system 100 may further comprise a fluid dispense system 132. The fluid dispense system 132 may be used to deposit a polymerizable material 134 on the substrate 102. The polymerizable material 134 may be positioned upon the substrate 102 using techniques such as drop dispense, spin-coating, dip coating, chemical vapor deposition (CVD), physical vapor deposition (PVD), thin film deposition, thick film deposition, and/or the like. In some examples, the polymerizable material 134 is positioned upon the substrate 102 before and/or after a desired volume is defined between the mold 110 and the substrate 102. The polymerizable material 134 may comprise a monomer as described in U.S. Pat. No. 7,157,036 and U.S. Patent Application Publication No. 2005/0187339, all of which are hereby incorporated by reference herein. In some examples, the polymerizable material 134 is positioned upon the substrate 102 as a plurality of droplets 136.

Figure 2:
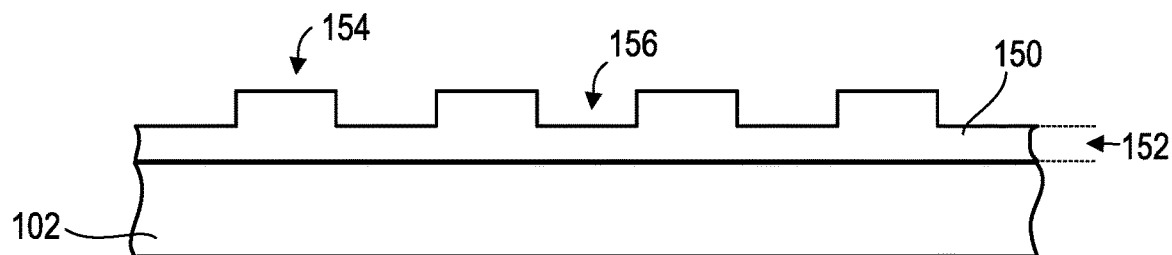
FIG. 2 illustrates a simplified side view of the substrate shown in FIG. 1 having a patterned layer positioned thereon.

Referring to FIGS. 1 and 2, the imprint lithography system 100 may further comprise an energy source 138 coupled to direct energy 140 along a path 142. In some examples, the imprint head 130 and the stage 106 is configured to position the template 108 and the substrate 102 in superimposition with the path 142. The imprint lithography system 100 may be regulated by a processor 144 in communication with the stage 106, the imprint head 130, the fluid dispense system 132, and/or the energy source 138, and may operate on a computer readable program stored in a memory 146.

In some examples, the imprint head 130, the stage 106, or both, vary a distance between the mold 110 and the substrate 102 to define a desired volume therebetween that is filled by the polymerizable material 134. For example, the imprint head 130 may apply a force to the template 108 such that the mold 110 contacts the polymerizable material 134. After the desired volume is filled by the polymerizable material 134, the energy source 138 produces energy 140, e.g., broadband ultraviolet radiation, causing the polymerizable material 134 to solidify and/or cross-link conforming to shape of a surface 148 of the substrate 102 and the patterning surface 112, defining a patterned layer 150 on the substrate 102. In some examples, the patterned layer 150 may comprise a residual layer 152 and a plurality of features shown as protrusions 154 and recessions 156, with the protrusions 154 having a thickness $t_1$ and the residual layer 152 having a thickness $t_2$.

The above-described system and process may be further implemented in imprint lithography processes and systems referred to in U.S. Pat. No. 6,932,934, U.S. Patent Application Publication No. 2004/0124566, U.S. Patent Application Publication No. 2004/0188381, and U.S. Patent Application Publication No. 2004/0211754, each of which is hereby incorporated by reference herein.

The above-described imprinting process can require high and low magnitude forces to be applied at different times by the imprint head 130 to the template chuck 128 and/or the template 108. It is desirable for the imprint head 130 to provide accuracy and stability during application of low magnitude forces, while also being able to provide high magnitude forces when needed. However, applying high magnitude forces can result in overlay misalignments and induce undesirable errors in force control during certain states of the system 100 (e.g., during fluid filling and polymerization). That is, using actuators sized for a high force capability (e.g., 200 N) may cause undesirable force errors or fluctuations when trying to control the applied force during the states that require the application and control of precise low magnitude force (e.g., 2 N). Provided herein are a method and a system for hybrid imprint force control, including a dual functioning actuation module connected with a common controller to selectively generate and apply such high and low magnitude forces.

Figure 3:
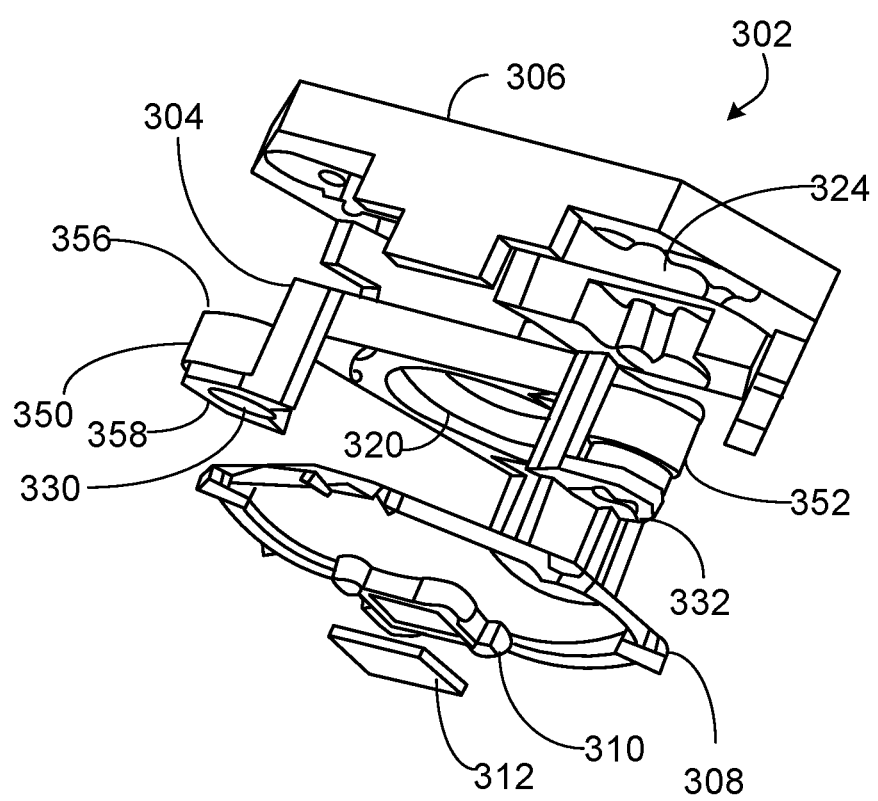
FIG. 3 is an exploded perspective view of the imprint head shown in FIG. 1.
Figure 4:
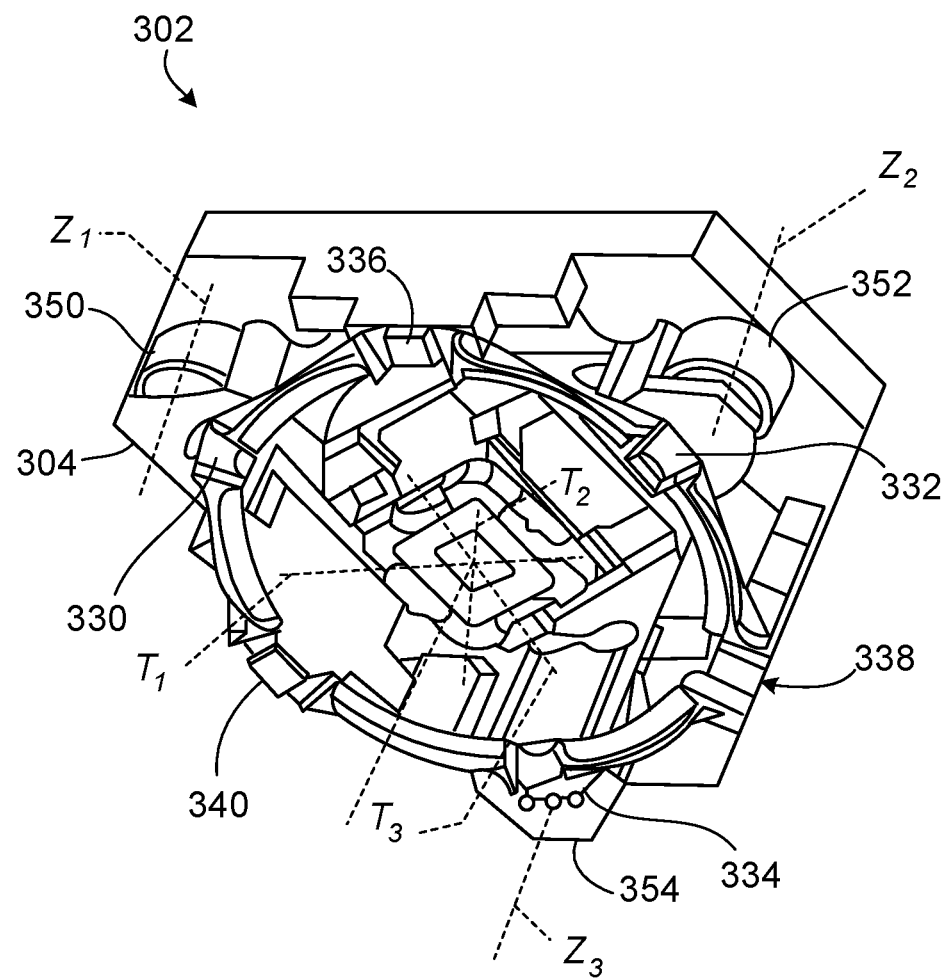
FIG. 4 is a perspective view of the imprint head shown in FIG. 1.

Referring to FIGS. 3 and 4, an example imprint head (or orientation stage) 302 is shown, similar to the imprint head 130 of FIG. 1. The imprint head 302 includes an inner frame 304 disposed proximate to an outer frame 306, and a flexure ring 308. The components of the imprint head 302 may be formed from any suitable material, e.g., aluminum, stainless steel and the like and may be coupled together using any suitable means. A template chuck 310 is coupled to the imprint head 302. The template chuck 310 is configured to support a template 312, similar to that described above with respect to FIG. 1.

The inner frame 304 has a central throughway 320, and the outer frame 306 has a central opening 324 in superimposition with the central throughway 320. The flexure ring 308 has an annular shape, e.g., circular or elliptical, and is coupled to the inner frame 304 and the outer frame 306 and lies outside of both the central throughway 320 and the central opening 324. Specifically, the flexure ring 308 is coupled to the inner frame 304 at regions 330, 332, and 334 and outer frame 306 at regions 336, 338, and 340. Region 336 is disposed between regions 330 and 332 and disposed equidistant therefrom; region 338 is disposed between regions 332 and 334 and disposed equidistant therefrom; and region 340 is disposed between regions 330 and 334 and disposed equidistant therefrom. In this manner, the flexure ring 308 surrounds the template chuck 310 and the template 312 and fixedly attaches the inner frame 304 to the outer frame 306.

The imprint head 302 is configured to control movement of the template 312 and place the same in a desired spatial relationship with respect to a substrate (e.g., the substrate 102 of FIG. 1). A plurality of actuation modules 350, 352, and 354 are connected between the outer frame 306 and the inner frame 304 so as to be spaced about the imprint head 302. Each of the actuation modules 350, 352, and 354 has a first end 356 and a second end 358. The first end 356 of the actuation module 350 faces the outer frame 306, and the second end 358 faces the inner frame 304. The actuation modules 350, 352, and 354 tilt the inner frame 304 with respect to the outer frame 306 by facilitating translational motion of the inner frame 304 along three axes $Z_1$, $Z_2$, and $Z_3$. The imprint head 302 may provide a range of motion of approximately ±1.2 mm along the axes $Z_1$, $Z_2$, and $Z_3$. In this fashion, the actuation modules 350, 352, and 354 cause the inner frame 304 to impart angular motion to the template 312 and the template chuck 310 about one or more of a plurality of axes $T_1$, $T_2$, and $T_3$. Specifically, by decreasing a distance between the inner frame 304 and the outer frame 306 along the axes $Z_2$ and $Z_3$ and increasing a distance therebetween along axis $Z_1$, angular motion about tilt axis $T_2$ occurs in a first direction. Increasing the distance between the inner frame 304 and the outer frame 306 along the axes $Z_2$ and $Z_3$ and decreasing the distance therebetween along axis $Z_1$, angular motion about tilt axis $T_2$ occurs in a second direction opposite to the first direction. In a similar manner, angular movement about the axis $T_1$ may occur by varying the distance between the inner frame 304 and the outer frame 306 by movement of the inner frame 304 along axes $Z_1$ and $Z_2$ in the same direction and magnitude while moving of the inner frame 304 along the axis $Z_3$ in a direction opposite and twice to the movement along axes $Z_1$ and $Z_2$. Similarly, angular movement about the axis $T_3$ may occur by varying the distance between the inner frame 304 and the outer frame 306 by movement of the inner frame 304 along the axes $Z_1$ and $Z_3$ in the same direction and magnitude while moving of the inner frame 304 along the axis $Z_2$ in a direction opposite and twice to the movement along the axes $Z_1$ and $Z_3$. Actuation modules 350, 352, and 354, can likewise cause the inner frame 304 to translate along the z-axis by increasing or decreasing the distances $Z_1$, $Z_2$, $Z_3$ in the same direction and magnitude, thereby increasing or decreasing a distance between template 312 and a substrate (e.g., the substrate 102 of FIG. 1).

In some examples, the actuation modules 350, 352, and 354 are coupled between the inner frame 304 and the outer frame 306 so as to be symmetrically disposed thereabout and lie outside of the central throughway 320 and the central opening 324. With this configuration, an unobstructed throughway between the outer frame 306 to the template chuck 310 is configured.

Figure 5:
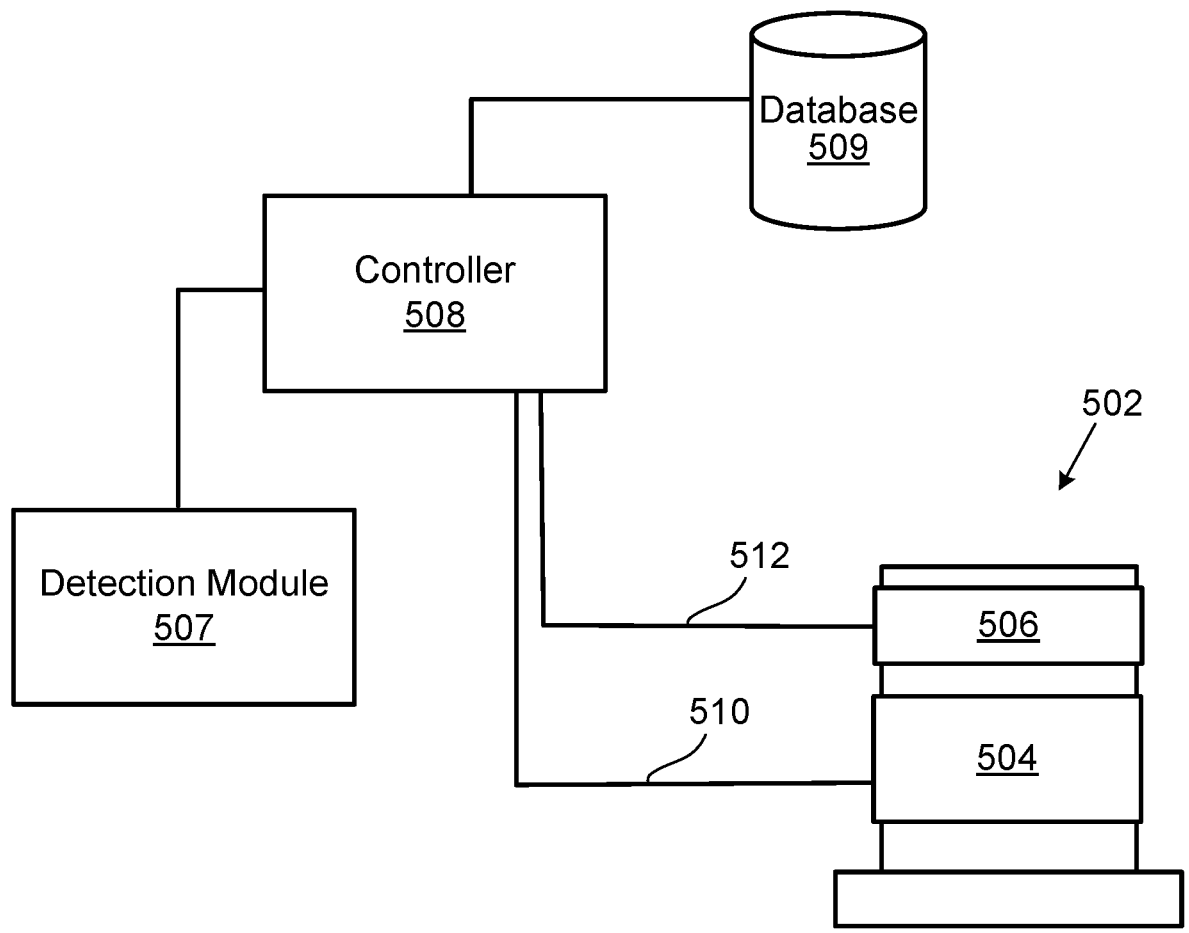
FIG. 5 illustrates an actuation module.

FIG. 5 illustrates an actuation module 502. The actuation module 502 can be similar to any one of the actuation modules 350, 352, or 354 of FIGS. 3 and 4. The actuation module 502 includes a first actuator 504 and a second actuator 506. The actuation module 502 is in communication with a controller 508. The controller 508 is in communication with a detection module 507 and a database 509.

The first actuator 504 and the second actuator 506 are configured to apply a first force and a second force, respectively, to the template 312. For example, the first actuator 504 applies the first force and the second actuator 506 applies the second force to the template 312 indirectly by applying the forces to the inner frame 304 and the outer frame 306, and providing movement along one of the plurality of axes $Z_1$, $Z_2$, and $Z_3$, as described above. Furthermore, the first actuator 504 is associated with a first control loop 510 that connects the controller 508 with the first actuator 504 such that the controller 508 is able to provide a first control signal to the first actuator 504, described below. Similarly, the second actuator 506 is associated with a second control loop 512 that connects the controller 508 with the second actuator 506 such that the controller 508 is able to provide a second control signal to the second actuator 506, described below.

The first control loop 510 and the second control loop 512 are different and independent from each other. That is, the first actuator 504 and the second actuator 506 can be controlled independently by a common controller, i.e., the controller 508, described below.

The detection module 507 is configured to determine a force requirement of the actuation module 502. That is, the detection module 507, in some examples, can determine a current state of the imprint lithography system, shown in FIG. 1. In some examples, the states can be associated with i) an initial contact between the template and a polymerizable material on a substrate (e.g., the substrate 102 of FIG. 1) ii) filling of features of the template by a polymerizable material (e.g., the features of the template by the polymerizable material 134 of FIG. 1); iii) polymerization of a fluid (e.g., the polymerizable material 134 of FIG. 1); and iv) separation of the template and a polymeric layer positioned on the substrate (e.g., the substrate 102 of FIG. 1). The detection module 507 is configured to generate a signal associated with the force requirement and/or state of the imprint lithography system, and provide the same to the controller 508. In particular, during polymerization it is important to minimize image distortion due to excessive imprinting force. That is, it is advantageous for the imprinting force applied during the polymerization to be zero or at least close to zero. Otherwise, image placement may suffer from localized distortion caused by the application of larger forces.

The database 509 can store one or more database tables (e.g., look-up tables) that indicate correspondences (or relationships) between the state of the imprint lithography system and magnitudes of the first force and the second force. For example, for a particular type of state of the imprint lithography system, described above, a magnitude of the first force and the second force is provided.

The controller 508 is configured to provide, using the first control loop 510, the first control signal to the first actuator 504 such that the first actuator 504 applies the first force. Additionally, the controller 508 is configured to provide, using the second control loop 512, the second control signal to the second actuator 506 such that the second actuator 506 applies the second force. The controller 508 can access the database 509.

In some implementations, the detection module 507 determines a particular state (or force requirement) associated with the imprint lithography system (e.g., the system 100 of FIG. 1). The detection module 507 generates a signal based on the determined state, and provides the signal to the controller 508. The controller 508 receives the signal from the detection module 507, and in response, accesses the database 509 to identify, based on the determined state of the signal, a magnitude of the first force associated with the first actuator 504 and a magnitude of the second force associated with the second actuator 506.

The controller 508, based on the identified magnitude of the first force, generates a first control signal and provides the first control signal, using the first control loop 510, to the first actuator 504. The first control signal includes magnitude-based data associated with the first force, as identified from the database 509. The first actuator 504 receives the first control signal, and in response, applies the first force to the template 312 with the appropriate magnitude.

Similarly, the controller 508, based on the identified magnitude of the second force, generates a second control signal and provides the second control signal, using the second control loop 512, to the second actuator 506. The second control signal includes magnitude-based data associated with the second force, as identified from the database 509. The second actuator 506 receives the second control signal, and in response, applies the second force to the template 312 with the appropriate magnitude. Thus, the same controller, i.e., the controller 508, provides the first control signal and the second control signal to independently control the first actuator 504 and the second actuator 506 using different control loops, i.e., the first control loop 510 and the second control loop 512.

Based on the applied first force and second force, the desired spatial relationship between the template 312 with respect to a substrate (e.g., the substrate 102 of FIG. 1) is obtained. The desired spatial relationship can be based on the state of the imprint lithography system, detailed below.

In some examples, a magnitude of the first force is greater than the magnitude of the second force. In some examples, the first force is between 0.1 N and 300 N, and the second force is between 0.1 N and 3 N.

Furthermore, the above-mentioned process can be applied to one or more of the actuation modules 350, 352, or 354 of FIGS. 3 and 4.

In some use-case examples, the state of the system (e.g., the imprint lithography system 100) can be associated with a "low-force" state. That is, only the second force is applied by the second actuator 506 to the template 312, and the first actuator 504 does not apply the first force to the template 312. For example, such a state of the system can be associated with i) a filling of features of the template 312 by a polymerizable material (e.g., the features of the template by the polymerizable material 134 of FIG. 1) and ii) polymerization of the polymerizable material. In some examples, during such "low-force" states of the system, it may be desirable to apply a low force to the template 312 with the second actuator 506 to minimize, if not prevent, errors in application of the force control.

In the instant example, the controller 508 accesses the database 509 to identify, based on the "low-force" state of the system 100, a magnitude of the first force associated with the first actuator 504 and a magnitude of the second force associated with the second actuator 506. To that end, the magnitude of the first force is zero, and the magnitude of the second force is between 0.1 N and 3 N.

The controller 508, based on the identified magnitudes of the first force (zero) and the second force (non-zero), only generates the second control signal and provides the second control signal, using the second control loop 512, to the second actuator 506. As a result, only the second actuator 506 applies the second force to the template 312 with the non-zero magnitude. In some examples, application of the non-zero magnitude second force by the second actuator 506 facilitates filling of features of the template 312 by the polymerizable material (e.g., the polymerizable material 134 of FIG. 1). In some examples, application of the non-zero magnitude second force by the second actuator 506 is required during polymerization of the polymerizable material that is in contact with the template 312.

In some use-case examples, the state of the system (e.g., the imprint lithography system 100) can be associated with a "high-force" state. That is, the first actuator 504 applies the first force to the template 312, and in some examples, the second actuator 506 also applies the second force to the template 312. For example, such a state of the system can be associated with i) an initial contact between the template 312 and a substrate (e.g., the substrate 102 of FIG. 1); and ii) separation of the template 312 and a polymeric layer positioned on the substrate (e.g., the substrate 102 of FIG. 1).

In the instant example, the controller 508 accesses the database 509 to identify, based on the "high-force" state of the system 100, a magnitude of the first force associated with the first actuator 504 and a magnitude of the second force associated with the second actuator 506. To that end, the magnitude of the first force is between 0.1 N and 300 N, and the magnitude of the second force is between 0.1 N and 3 N.

The controller 508, based on the identified magnitudes of the first force (non-zero) and the second force (non-zero), generates the first control signal and provides the first control signal, using the first control loop 510, to the first actuator 504; and generates the second control signal and provides the second control signal, using the second control loop 512, to the second actuator 506. The first actuator 504 and the second actuator 506 apply the first force and the second force, respectively.

In some examples, application of the non-zero magnitude first force by the first actuator 504, and in some examples, in combination with application of the non-zero magnitude second force by the second actuator 506, facilitates an initial contact between the template 312 and the polymerizable material (e.g., the polymerizable material 134 of FIG. 1). In some examples, application of the non-zero magnitude first force by the first actuator 504, and in some examples, in combination with application of the non-zero magnitude second force by the second actuator 506, facilitates separation between the template 312 and the polymeric layer positioned on the substrate (e.g., the substrate 102 of FIG. 1).

Figure 7:
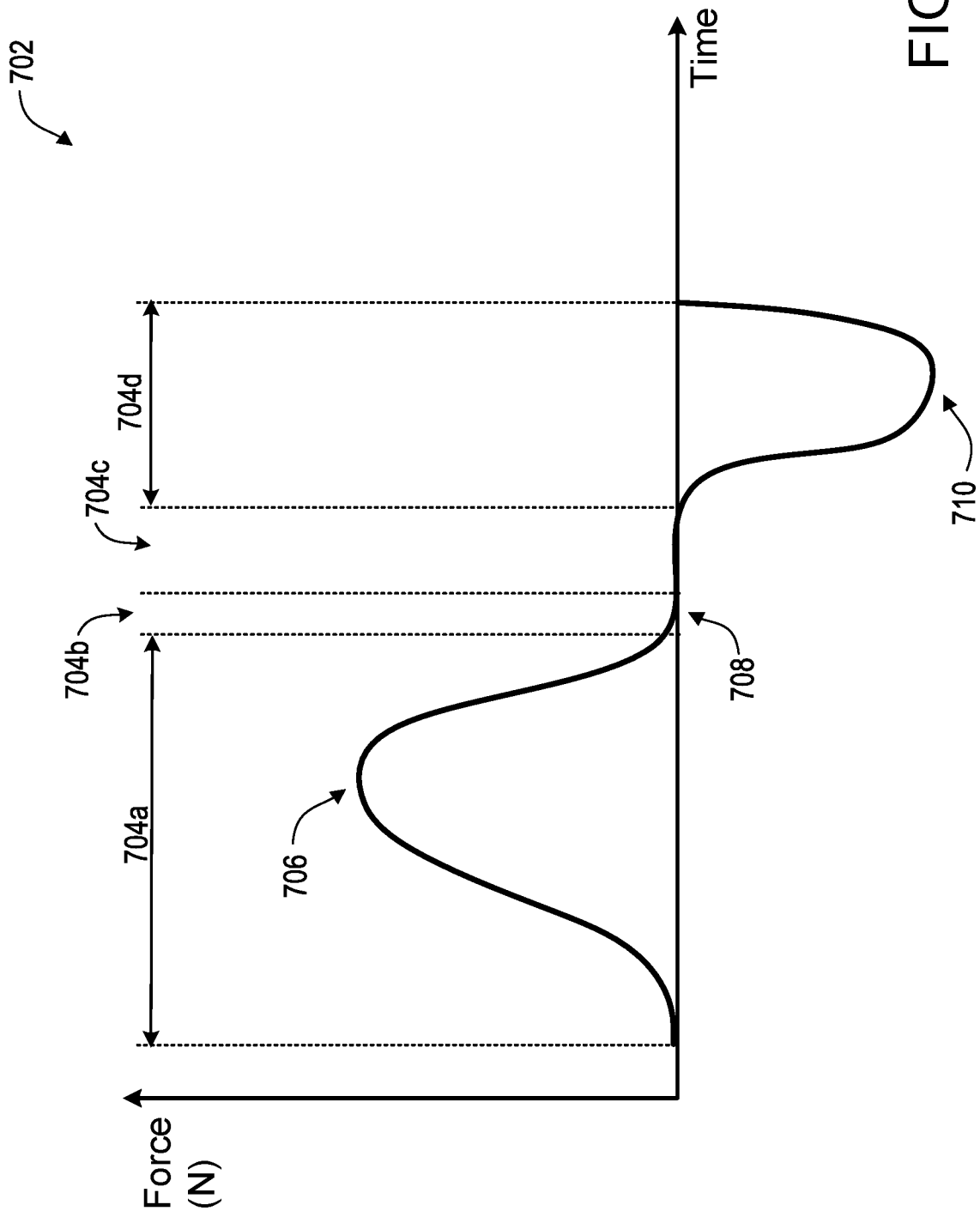
FIG. 7 illustrates a chart of application of the imprint force over time.

In some examples, a transition between the application of the first force by the first actuator 504 and the second force by the second actuator 506 can occur based on the state of the system. FIG. 7 illustrates a graph 702 of the force magnitude associated with each state of the system as a function of time. Specifically, FIG. 7 includes four zones 704*a*, 704*b*, 704*c*, 704*d* (collectively referred to as zones 704) each associated with a state of the system. Zone 704*a* is associated with the initial contact between the template and the polymerizable material on the substrate (e.g., the substrate 102 of FIG. 1) and the spreading of such material as the template conforms to the substrate. Zone 704*b* is associated with the filling of features of the template by the polymerizable material (e.g., the features of the template by the polymerizable material 134 of FIG. 1). Zone 704c is associated with polymerization of the fluid (e.g., the polymerizable material 134 of FIG. 1). Zone 704d is associated with the separation of the template and the polymeric layer positioned on the substrate (e.g., the substrate 102 of FIG. 1).

To that end, the process associated with the system begins at 704a, and the state of initial contact between the template and the polymerizable material on the substrate. As mentioned above, the first force is applied by the first actuator 504 in response to the first control signal to a peak force 706. As contact between the template and the polymerizable material on the substrate continues over time, the magnitude of the first force is decreased from the peak force 706, and transitions from the zone 704a to the zone 704b including the state of the system transitioning to the state of filling of features of the template by the polymerizable material. During this transition phase, the magnitude of the first force that is applied by the first actuator 504 is decreased and the magnitude of the second force that is applied by the second actuator 506 is increased, and a switching point 708 occurs where the magnitude of the first force is zero and only the second force is applied and is associated with the zone 704b ("low-force" state)—e.g., 0.1 N or 2 N.

After the filling of features occurs within zone 704b, the system continues to the process associated with zone 704c—polymerization of the fluid. As mentioned above, the state of the system associated with polymerization of the fluid is a "low-force" state, and as such, the magnitude of the first force remains zero while the second actuator 506 applies the second force. As the system transitions to zone 704d that is associated with separation of the template and the polymeric layer positioned on the substrate, the magnitude of the first force that is applied by the first actuator 504 is increased to a peak force 710 such that the template separates from the polymeric layer. In some examples, during this transition phase, the magnitude of the second force applied by the second actuator 506 is decreased (e.g., from 2 N to 0 N) and the magnitude of the first force applied by the first actuator 504 is concurrently increased (e.g., from 0 N to the peak force 710).

Figure 8:
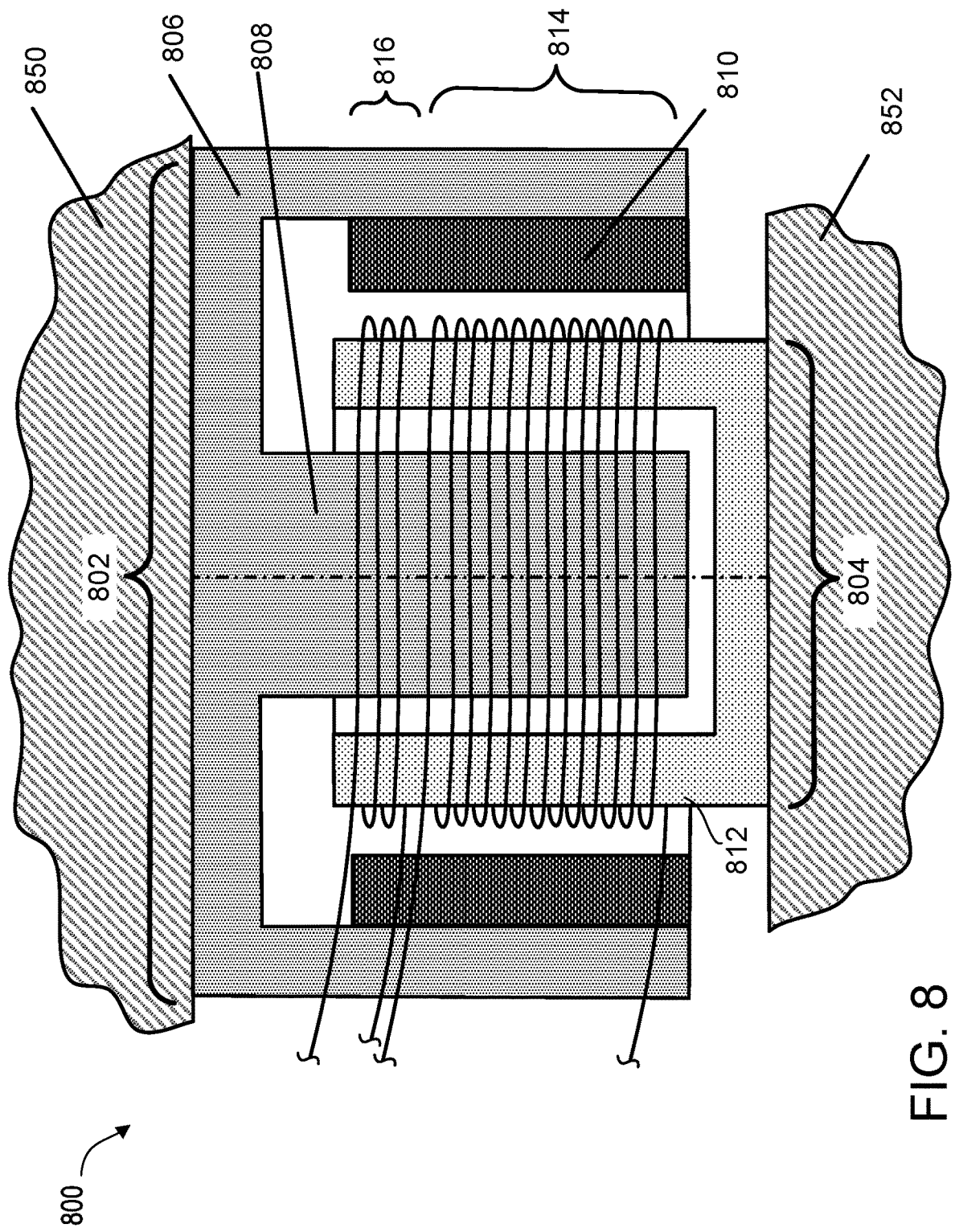
FIG. 8 illustrates a side view of an example implementation of an actuation module.

FIG. 8 illustrates a side view of an example implementation of an actuation module 800. The actuation module 800 can be similar to the actuation module 502 of FIG. 5, or any one of the actuation modules 350, 352, or 354 of FIGS. 3 and 4. The actuation module 800 includes a magnetic (field) assembly 802 that is attached to outer frame 306 and a coil assembly 804 that is attached to inner frame 304. The magnetic assembly 802 and the coil assembly 804 can be moveable relative to one another, as described herein.

The magnetic assembly 802 includes an outer ferromagnetic hollow cylinder 806, an inner cylindrical ferromagnetic core 808, and a cylindrical permanent magnet 810. The permanent magnet 810 is positioned between the outer ferromagnetic hollow cylinder 806 and the inner cylindrical ferromagnetic core 808. In some examples, the permanent magnet 810 is composed of a rare earth material that exhibits a strong magnetic field, such as, for example, neodynium iron boron, or samarium cobalt. The outer ferromagnetic hollow cylinder 806 is further coupled to an imprint head outer frame 850.

The coil assembly 804 includes a hollow cylinder 812 with a first winding 814 of wire and a second winding 816 of wire wound about the hollow cylinder 812, and are both fixedly attached to the hollow cylinder 812. The first winding 814 is wound about the hollow cylinder 812 $w_1$ times (e.g., $w_1$ turns) and the second winding 816 is wound about the hollow cylinder 812 $w_2$ times (e.g., $w_2$ turns). In some examples, $w_1$ is greater than $w_2$. In some examples, the first winding 814 corresponds to the first actuator 504 and the second winding 816 corresponds to the second actuator 506. The hollow cylinder 804 is further coupled to an imprint head inner frame 852.

In response to a control signal, e.g., a first control signal provided by the controller 508 using the first control loop 510, a voltage is applied to the first winding 814 to provide a current flow through the first winding 814. As the first winding 814 is positioned within a magnetic field, the first winding 814 exerts a first force (a Lorentz force). This first force is transferred to the hollow cylinder 812 as the first winding 814 is attached to the hollow cylinder 812. The first force transferred to the hollow cylinder 812 by the first winding 814 is proportional to the turns of the first winding 814, e.g., $w_1$ turns.

Similarly, in response to a control signal, e.g., a second control signal provided by the controller 508 using the second control loop 512, a voltage is applied to the second winding 816 to provide a current flow through the second winding 816. As the second winding 816 is positioned within a magnetic field, the second winding 816 exerts a second force (a Lorentz force). This second force is transferred to the hollow cylinder 812 as the second winding 816 is attached to the hollow cylinder 812. The second force transferred to the hollow cylinder 812 by the second winding 816 is proportional to the turns of the second winding 816, e.g., $w_2$ turns.

In some examples, as $w_1$ is greater than $w_2$, and assuming the current flow to each is the same, the magnitude of the first force is greater than the magnitude of the second force, similar to that as described herein with respect to FIG. 5.

In some examples, a position of the first winding 814 and the second winding 816 can be based on a magnetic flux density of the actuation module 802. In some examples, a position of the first winding 814 and the second winding 816 can be based on a consistency of the magnetic field (e.g., as the coil assembly 804 translates with respect to the magnetic assembly 802). In some examples, the position of the first winding 814 and the second winding 816 can partially overlap, or fully overlap with electrical isolation from each other.

Figure 6:
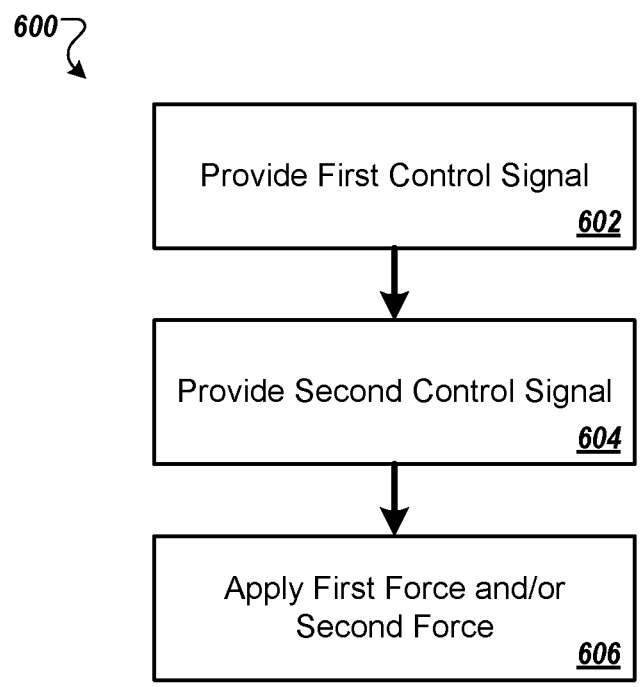
FIG. 6 is a flow chart for applying an imprint force to an imprint lithography template.

FIG. 6 provides an example method of applying an imprint force to an imprint lithography template. The process 600 is illustrated as a collection of referenced acts arranged in a logical flow graph. The order in which the acts are described is not intended to be construed as a limitation, and any number of the described acts can be combined in other orders and/or in parallel to implement the process.

A first control signal is provided by a controller using a first control loop to a first actuator associated with the first control loop (602). For example, the controller 508 provides the first control signal using the first control loop 510 to the first actuator 504. A second control signal is provided, by the controller using a second control loop, to a second actuator associated with the second control loop (604). For example, the controller 508 provides the second control signal using the second control loop 512 to the second actuator 506. In some examples, the first control loop 510 and the second control loop 512 are different. At least one of a first force and a second force is applied to the imprint lithography template (606). Specifically, the first actuator applies the first force in response to the first control signal, and/or the second actuator applies the second force in response to the second control signal. For example, the first actuator 504 applies, in response to the first control signal, the first force to the template 312, and/or the second actuator 506 applies, in response to the second control signal, the second force to the template 312.

What is claimed is:

1. A method of applying an imprinting force to an imprint lithography template, the method comprising:
   providing, by a controller using a first control loop, a first control signal to a first actuator associated with the first control loop;
   providing, by the controller using a second control loop, a second control signal to a second actuator associated with the second control loop, wherein the second control loop and the first control loop are different; and
   applying, to the imprint lithography template:
      a first force by the first actuator in response to the first control signal, and
      a second force by the second actuator in response to the second control signal,
         wherein the first force and the second force act in the same direction on the imprint lithography template.

2. The method of claim 1, comprising applying the first force to the imprint lithography template to facilitate an initial contact between the imprint lithography template and an imprint resist positioned on a substrate.

3. The method of claim 2, comprising applying only the second force to the imprint lithography template to facilitate filling of features of the imprint lithography template by an imprint resist in contact with the imprint lithography template.

4. The method of claim 3, wherein the second force is between 0.1 N and 3 N.

5. The method of claim 3, wherein the first force is greater than the second force.

6. The method of claim 5, wherein the first force is between 0.1 N and 300 N, and the second force is between 0.1 N and 3 N.

7. The method of claim 2, comprising applying the second force to the imprint lithography template to facilitate the initial contact between the imprint lithography template and an imprint resist positioned on the substrate.

8. The method of claim 1, comprising applying only the second force to the imprint lithography template during polymerization of an imprint resist positioned on a substrate, the imprint resist in contact with the imprint lithography template.

9. The method of claim 1, comprising applying the first force to the imprint lithography template to facilitate separation of the imprint lithography template and a polymeric layer positioned on a substrate.

10. The method of claim 9, comprising applying the second force to the imprint lithography template to facilitate separation of the imprint lithography template and the polymeric layer positioned on the substrate.

11. The imprint lithography method of claim 1, wherein the first force and the second force act along a direction orthogonal to a patterned surface of the imprint lithography template.

12. The imprint lithography method of claim 1, wherein the imprint lithography template is positioned proximate a substrate, and the first force is applied by the actuator to the imprint lithography template to increase or decrease a distance between the imprint lithography template and the substrate.

13. The imprint lithography method of claim 12, wherein the second force is applied by the actuator to the imprint lithography template to increase or decrease the distance between the imprint lithography template and the substrate.

14. An actuation system for applying an imprinting force to an imprint lithography template, the system comprising:
   a first actuator configured to apply a first force to the imprint lithography template, the first actuator associated with a first control loop;
   a second actuator configured to apply a second force to the imprint lithography template, the second actuator associated with a second control loop, wherein the first control loop and the second control loop are different; and
   a controller configured to provide:
      a first control signal to the first actuator via the first control loop such that the first actuator applies the first force to the imprint lithography template, and
      a second control signal to the second actuator via the second control loop such that the second actuator applies the second force to the imprint lithography template, wherein the first force and the second force act in the same direction on the imprint lithography template.

15. The actuation system of claim 14, wherein the controller is configured to provide only the second control signal to the second actuator such that the second actuator applies the second force to the imprint lithography template during polymerization of an imprint resist positioned on a substrate, the imprint resist in contact with the imprint lithography template.

16. The actuation system of claim 14, wherein the controller is configured to provide the first control signal to the first actuator such that the first actuator applies the first force to the imprint lithography template to facilitate separation of the imprint lithography template and a polymeric layer positioned on a substrate.

17. The actuation system of claim 16, wherein the controller is configured to provide the second control signal to the second actuator such that the second actuator applies the second force to the imprint lithography template to facilitate separation of the imprint lithography template and a polymeric layer positioned on the substrate.

18. The actuation system of claim 14, wherein the controller is configured to provide the first control signal to the first actuator such that the first actuator applies the first force to the imprint lithography template to facilitate an initial contact between the imprint lithography template and an imprint resist positioned on a substrate.

19. The actuation system of claim 18, wherein the controller is configured to provide only the second control signal to the second actuator such that the second actuator applies the second force to the imprint lithography template to facilitate filling of features of the imprint lithography template by an imprint resist in contact with the imprint lithography template.

20. The actuation system of claim 18, wherein the controller is configured to provide the second control signal to the second actuator such that the second actuator applies the second force to the imprint lithography template to facilitate the initial contact between the imprint lithography template and the imprint resist positioned on the substrate.

21. The imprint lithography method of claim 14, wherein the first force and the second force act along a direction orthogonal to a patterned surface of the imprint lithography template.

22. An imprint lithography method of manufacturing an article, the method comprising:

disposing an imprint resist on a substrate positioned opposite an imprint lithography template;

providing, by a controller using a first control loop, a first control signal to a first actuator associated with the first control loop;

providing, by the controller using a second control loop, a second control signal to a second actuator associated with the second control loop, wherein the second control loop and the first control loop are different;

applying, to the imprint lithography template:
- a first force by the first actuator in response to the first control signal, and
- a second force by the second actuator in response to the second control signal, wherein the first force and the second force act in the same direction on the imprint lithography template;

in response to applying the at least one of the first force and the second force, contacting the imprint resist with the imprint lithography template;

polymerizing the imprint resist to yield a polymeric layer in contact with the imprint lithography template; and separating the imprint lithography template from the polymeric layer to yield the article.

* * * * *